(12) United States Patent
Kenkare et al.

(10) Patent No.: US 8,120,975 B2
(45) Date of Patent: Feb. 21, 2012

(54) MEMORY HAVING NEGATIVE VOLTAGE WRITE ASSIST CIRCUIT AND METHOD THEREFOR

(75) Inventors: Prashant U. Kenkare, Austin, TX (US); Troy L. Cooper, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 197 days.

(21) Appl. No.: 12/361,826

(22) Filed: Jan. 29, 2009

(65) Prior Publication Data

US 2010/0188909 A1 Jul. 29, 2010

(51) Int. Cl.
*G11C 11/146* (2006.01)

(52) U.S. Cl. ............. 365/189.16; 365/154; 365/189.11; 365/189.02

(58) Field of Classification Search ............. 365/189.19
See application file for complete search history.

(56) References Cited

U.S. PATENT DOCUMENTS

| | | | |
|---|---|---|---|
| 5,091,889 A | 2/1992 | Hamano et al. | |
| 5,153,855 A | 10/1992 | Konishi | |
| 5,193,198 A * | 3/1993 | Yokouchi | 327/536 |
| 5,475,635 A | 12/1995 | Nogle | |
| 5,619,456 A | 4/1997 | McClure | |
| 5,751,642 A | 5/1998 | Yoo | |
| 5,841,706 A | 11/1998 | Umezaki et al. | |
| 5,886,947 A | 3/1999 | Lee | |
| 5,973,972 A | 10/1999 | Kwon et al. | |
| 6,026,035 A | 2/2000 | Kim | |
| 6,097,653 A | 8/2000 | Park | |
| 6,104,653 A | 8/2000 | Proebsting | |
| 6,288,952 B1 * | 9/2001 | Zheng | 365/189.11 |
| 6,671,201 B2 | 12/2003 | Masuda | |
| 6,778,429 B1 | 8/2004 | Lu et al. | |
| 6,930,939 B2 | 8/2005 | Lim et al. | |

(Continued)

FOREIGN PATENT DOCUMENTS

| | | |
|---|---|---|
| JP | 2005276277 A | 6/2005 |
| JP | 2007109300 A | 4/2007 |

OTHER PUBLICATIONS

PCT Application No. PCT/US2009/052817 with regard to related U.S. Appl. No. 12/233,922; Search Report and Written Opinion dated Feb. 22, 2010.

(Continued)

*Primary Examiner* — Tan T. Nguyen
(74) *Attorney, Agent, or Firm* — Daniel D. Hill; James L. Clingan, Jr.

(57) ABSTRACT

A method of writing data to a selected column of a memory includes selecting a first column. The data writing is initiated by applying a logic high to a first bit line of the first column and a first potential to a second bit line of the first column that is lower than the logic high. The first potential is removed and a second potential is applied to the second bit line. The second potential is less than the first potential. The first potential may be ground, and the second potential may be a negative voltage. Reducing the write voltage for the bit line that is receiving a logic low improves its ability to be written. By first bringing the logic low to the first potential, which may be ground, and then further reducing the applied voltage, the requirements on the source of the second potential are reduced.

20 Claims, 2 Drawing Sheets

U.S. PATENT DOCUMENTS

| | | | |
|---|---|---|---|
| 6,952,377 | B2 | 10/2005 | Chung |
| 7,130,387 | B2 | 10/2006 | Maruyama |
| 7,136,298 | B2 | 11/2006 | Frey |
| 7,158,404 | B2 * | 1/2007 | Lai ............................... 365/154 |
| 7,330,387 | B2 | 2/2008 | Lindstedt et al. |
| 7,366,007 | B2 | 4/2008 | Kanehara |
| 7,411,815 | B2 | 8/2008 | Gogl |
| 7,457,181 | B2 | 11/2008 | Lee et al. |
| 7,800,959 | B2 * | 9/2010 | Childs et al. ............. 365/189.08 |
| 2003/0185043 | A1 | 10/2003 | Masuda |
| 2007/0081379 | A1 | 4/2007 | Clinton et al. |
| 2007/0109878 | A1 | 5/2007 | Gouin et al. |
| 2007/0268738 | A1 | 11/2007 | Heinrich-Barna et al. |
| 2008/0130378 | A1 | 6/2008 | Nautiyal |

OTHER PUBLICATIONS

IBM Technical Disclosure: "Techniques for Improving Writability of SRAM Design".

PCT/US2010 International Search Report and Written Opinion mailed Aug. 24, 2010.

PCT Application No. PCT/US2009/052817 with regard to related U.S. Appl. No. 12/233922; Search Report and Written Opinion dated Feb. 22, 2010.

IBM Technical Disclosure: "Techniques for Improving Writability of SRAM Design", Nov. 2, 2007.

U.S. Appl. No. 12/233,922, Inventor L.F. Childs, et al., "Memory Having Self-Timed BIT Line Boost Circuit and method Therefor", filed Sep. 19, 2008, Office Action—Notice of Allowance mailed Mar. 29, 2010.

U.S. Appl. No. 12/233,922, Inventor L.F. Childs, et al., "Memory Having Self-Timed BIT Line Boost Circuit and method Therefor", filed Sep. 19, 2008, Office Action—Notice of Allowance mailed May 20, 2010.

* cited by examiner

# MEMORY HAVING NEGATIVE VOLTAGE WRITE ASSIST CIRCUIT AND METHOD THEREFOR

RELATED APPLICATION

A related, copending application is entitled "Memory Having Self-Timed Bit Line Boost Circuit and Method Therefor", by Childs et al., application Ser. No. 12/233,922, is assigned to the assignee hereof, and was filed on Sep. 19, 2008.

BACKGROUND

1. Field

This disclosure relates generally to memories, and more specifically, to a memory having a negative voltage write assist circuit and method therefor.

2. Related Art

Static random access memories (SRAMs) are generally used in applications requiring high speed, such as memory in a data processing system. Each SRAM cell stores one bit of data and is implemented as a pair of cross-coupled inverters. The SRAM cell is only stable in one of two possible voltage levels. The logic state of the cell is determined by whichever of the two inverter outputs is a logic high, and can be made to change states by applying a voltage of sufficient magnitude and duration to the appropriate cell input. The stability of a SRAM cell is an important issue. The SRAM cell must be stable against transients, process variations, soft error, and power supply fluctuations which may cause the cell to inadvertently change logic states. Also, the SRAM cell must provide good stability during read operations without harming speed or the ability to write to the cell.

However, good read stability can make it difficult to write to the memory cells. Also, process variations can cause some cells of the array to be more difficult to write than others. One way to have both good write performance and good read stability is to lower the memory array power supply voltage for write operations and raise the memory array power supply voltage for read operations. In addition, the write performance can be improved further by lowering the logic low bit line voltage below ground during the write operation. Typically, a capacitor bootstrapping circuit is used to boost the bit line voltage negative. However, a bootstrap circuit requires the use of a write driver circuit with relatively large transistors. Also, the ratio of capacitance between the bit line and the bootstrapping circuit is difficult to trim for different voltages.

Therefore, what is needed is a memory and a method for operating the memory that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
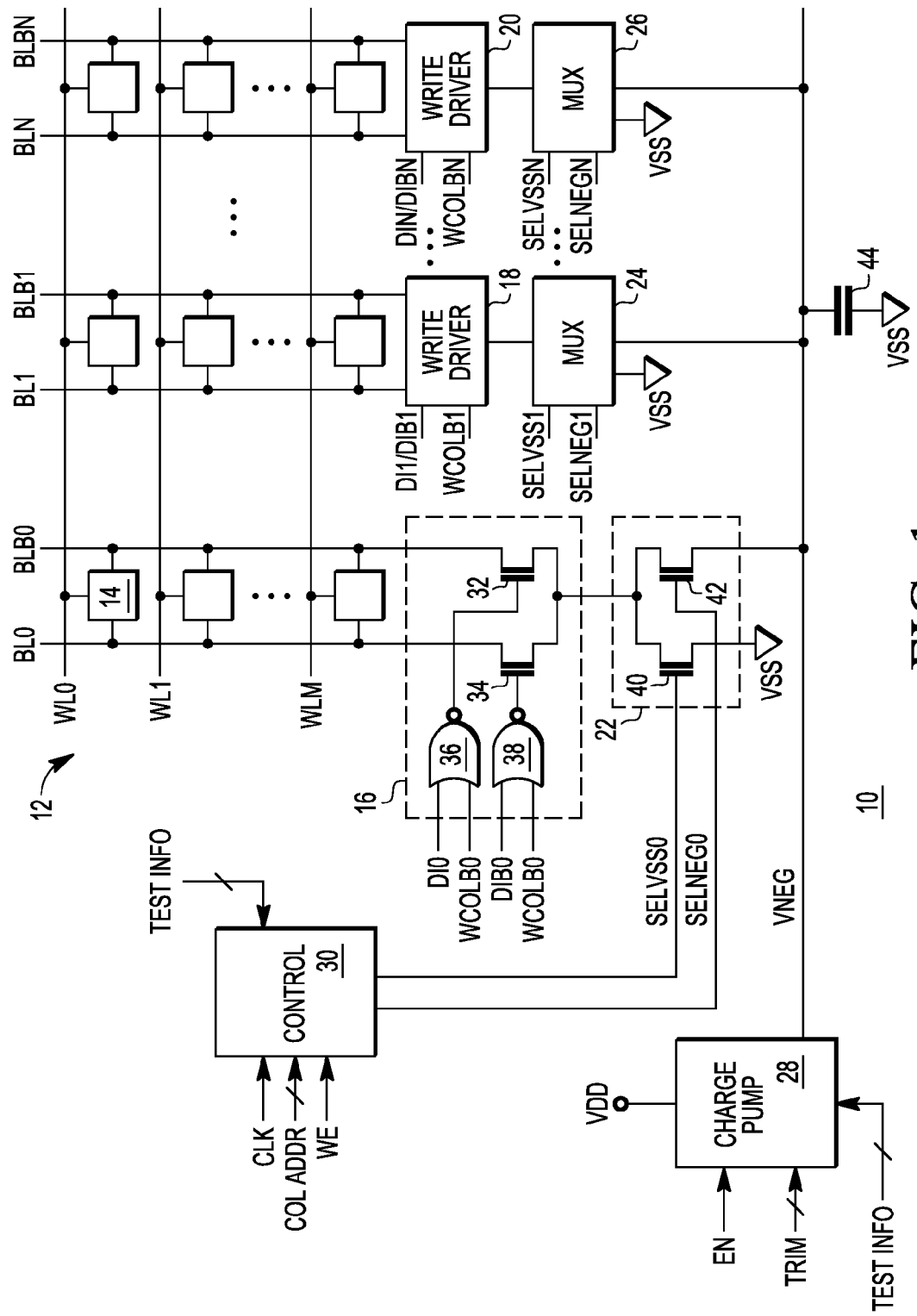
FIG. 1 illustrates, in block diagram form, an integrated circuit memory in accordance with an embodiment.

Generally, there is provided, an integrated circuit memory having a circuit to boost a bit line voltage to below ground level during a write operation. In one embodiment, the circuit includes a charge pump, a multiplexing circuit, and a capacitor. The charge pump generates a negative voltage and continually charges or maintains a predetermined voltage level on the capacitor. During the write operation, the multiplexer receives non-overlapping control signals to cause the bit line to be first pulled to ground, or some other predetermined voltage level, and then to a negative voltage, for example, 200 millivolts (mV). The capacitor is coupled to store negative charge to assist in boosting the bit line voltage below ground. In one embodiment, the memory is a static random access memory (SRAM). Also, in one embodiment, the memory array is first tested for memory cells that are relatively more difficult to write at a predetermined power supply voltage. The locations of those cells are stored, and only those cells receive the negative bit line boost during a write operation. In addition, charge pumps can be implemented for each subarray and individually trimmed so that the negative boost voltage is adjusted on a subarray basis.

In one aspect, there is provided, a method of writing data in a memory wherein the memory comprises a subarray having columns of pairs of bit lines, comprising: selecting a first column for writing; initiating the writing by applying a logic high to a first bit line of the first column and a first potential to a second bit line of the first column that is lower than the logic high; providing a second potential that is lower than the first potential; and removing the first potential and applying the second potential to the second bit line. The step of initiating the writing may be further characterized by the subarray being powered by a voltage differential no less than a difference between the logic high and the first potential. The step of initiating the writing may be further characterized by the first potential being ground. The method may further comprise a step of returning the first and second bit line to a common voltage. The method may further comprise: enabling a word line that intersects the first column prior to the step of removing; and disabling the word line prior to the step of returning. The method may further comprise: selecting a second column for writing; applying the logic high to a first bit line of the second column and the first potential to a second bit line of the second column; and returning the first and second bit lines of the second column to the common voltage without lowering the second bit line below the first potential. The method may further comprise: testing the first and second columns for weak bits for writing; identifying a weak bit for writing in the first column; and finding no weak bits for writing in the second column. The following steps may occur simultaneously: initiating the writing by applying a logic high to a first bit line of the first column and a first potential to a second bit line of the first column; and applying the logic high to a first bit line of the second column and the first potential to a second bit line of the second column. The step of initiating the writing by applying a logic high to a first bit line of the first column and a first potential to a second bit line of the first column may occur before the step of applying the logic high to a first bit line of the second column and the first potential to a second bit line of the second column. The step of removing the first potential and applying a second potential to the second bit line may be further characterized by the second potential varying at least 10 millivolt during its application to the second bit line.

In another aspect, there is provided, a memory, comprising: a subarray having columns, wherein each column has a pair of bit lines; a first write driver for maintaining a logic high at a first selected bit line of a first selected pair of bit lines and providing a logic low to a second selected bit line of the first selected pair of bit lines by coupling a negative power supply node to the second selected bit line; a charge pump for providing an output at a negative voltage; a first multiplexer having a first input coupled to the output of the charge pump, a second input coupled to a low power supply terminal for receiving a low voltage that is greater than the negative voltage, and an output coupled to the negative power supply node. The low voltage may be ground potential, and a capacitor may be coupled between a node at a predetermined potential, such as ground potential, and the output of the charge pump. Alternatively, the capacitor may be coupled between the output of the charge pump and a node that is at a potential different from ground potential. The first write driver may provide the logic high to the first selected bit line based upon a logic state of a data input signal received by the first write driver. A controller may be coupled to the first multiplexer that directs the first multiplexer to couple the low power supply terminal to the first write driver during an initial portion of a write cycle and directs the first multiplexer to couple the output of the charge pump to the first write driver after the initial portion of the write cycle. In another embodiment, a controller may be coupled to the first multiplexer that directs the first multiplexer to couple the low power supply terminal to the negative power supply node during an initial portion of a write cycle and determines if the first multiplexer should couple the output of the charge pump to the negative power supply node after the initial portion of the write cycle or if the first multiplexer should continue coupling the low power supply terminal to the negative power supply node during all of the write cycle. The controller may be further characterized as receiving test information that indicates which of the columns in the subarray are to be written with one of its bit lines coupled to the output of the charge pump. The memory may further comprise: a second write driver for maintaining a logic high to a first selected bit line of a second selected pair of bit lines and providing a logic low to a second selected bit line of the second selected pair of bit lines by coupling a second negative power supply node to the second selected bit line of the second selected pair of bit lines; and a second multiplexer having a first input coupled to the output of the charge pump, a second input coupled to a low power supply terminal for receiving a low voltage that is greater than the negative voltage, and an output coupled to the second negative power supply node.

In yet another aspect, there is provided, a method, comprising: providing a memory having a subarray having a plurality of columns, wherein each column of the plurality of columns has a pair of bit lines; writing data to a bitcell in a first selected column of the plurality of columns by enabling a word line that is coupled to the bitcell and applying a logic high to a first bit line of the first selected column and a logic low to a second bit line of the first selected column, wherein the step of applying the logic low comprises: applying a first potential to the second bit line that is a lower voltage than the logic high for an initial portion of a first write cycle; providing a negative voltage; and applying the negative voltage to the second bit line during a subsequent portion of the first write cycle. The method may further comprise: writing data to a bitcell in a second selected column of the plurality of columns by enabling a word line that is coupled to the bitcell and applying a logic high to a first bit line of the second selected column and a logic low to a second bit line of the second selected column, wherein the step of applying the logic low to the second bit line of the second selected column comprises: applying the first potential to the second bit line of the second selected column from a beginning of a second write cycle to an end of the second write cycle; and applying a common voltage to the first and second bit lines of the second selected column after the step of applying the first potential to the second bit line of the second selected column. The step of providing a memory may be further characterized by the first selected column having a bitcell that is weak for writing.

Using a charge pump to generate a relatively constant negative write assist voltage instead of a bootstrap circuit eliminates the need for very large write driver transistors. Also, the output voltage of the charge pump is more easily trimmed than the voltage provided by the bootstrap circuit because the charge pump output level is not as dependent on a capacitance ratio.

The semiconductor substrate described herein can be any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a letter "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in block diagram form, an integrated circuit memory 10 in accordance with an embodiment. In a preferred embodiment, memory 10 is an embedded SRAM in a data processing system including a processor, microcontroller, or the like. In another embodiment, memory 10 may be a different type of memory or a "standalone" memory. Integrated circuit memory 10 includes memory array 12, a plurality of write drivers including write drivers 16, 18, and 20, a plurality of multiplexing circuits including multiplexing circuits 22, 24, and 26, charge pump 28, and control circuit 30. Memory array 12 includes a plurality of memory cells, such as memory cell 14 organized in M+1 rows and N+1 columns, where M and N can be any integer. A column of memory cells includes a bit line pair and all of the memory cells connected to the bit line pair. For example, bit line pair BL0/BLB0 and the memory cells coupled to bit line pair BL0/BLB0, such as memory cell 14, comprise a column. Also, bit line pairs BL1/BLB1 and BLN/BLBN, with their respective memory cells each comprise a column. Likewise, a row of memory cells includes a word line and all of the memory cells connected to the word line. For example, word line WL0 and the memory cells coupled thereto comprises a row. Also, word lines WL1 and WLM and the memory cells coupled thereto each comprises a row. Memory cell 14 is at the intersection of a column having bit line pair BL0/BLB0 and a row having word line WL0. Write driver 16 includes N-channel transistors 32 and 34 and NOR logic gates 36 and 38. The other write drivers, such as write drivers 18 and 20 are identical to write driver 16. Multiplexer circuit 22 includes N-channel transistors 40 and 42. The other multiplexer circuits, such as multiplexer circuits 24 and 26 are identical to multiplexer circuit 22. Each of the memory cells of array 12 are six-transistor SRAM cells. Memory array 12 may be one memory array of a plurality of memory arrays. Each of the memory cells of array 12 receives a power supply voltage equal to about VDD, or 0.9 volts. In other embodiments, the SRAM cells may have a different number of transistors and receive a different power supply voltage. Alternatively, the memory cells may be 8-transistor register-file cells instead of 6-transistor SRAM cells.

In write driver 16, N-channel transistor 32 has a first current electrode (drain/source) coupled to bit line BLB0, a control electrode (gate), and a second current electrode (drain/source). N-channel transistor 34 has a first current electrode coupled to bit line BL0, a control electrode, and a second current electrode coupled to the second current electrode of transistor 32. NOR logic gate 36 has a first input for receiving an input data signal labeled "DI0", a second input for receiving write column address WCOLB0, and an output coupled to the control electrode of transistor 32. NOR logic gate 38 has a first input for receiving an input data signal labeled "DIB0", a second input for receiving write column address WCOLB0, and an output coupled to the control electrode of transistor 34. Write drivers 18 and 20 are the same as write driver 16 except that the received data and address signals are different.

In multiplexer 22, N-channel transistor 40 has a first current electrode coupled to the second current electrodes of transistors 32 and 34, a control electrode for receiving a select signal labeled "SELVSS0", and a second current electrode coupled to receive a power supply voltage labeled "VSS". In one embodiment, VSS is coupled to ground. In another embodiment, VSS may be coupled to receive a different power supply voltage. N-channel transistor 42 has a first current electrode coupled to the second current electrodes of transistors 32 and 34, a control electrode for receiving a select signal labeled "SELNEG0", and a second current electrode coupled to receive a negative voltage labeled "VNEG". Multiplexer 24 is the same as multiplexer 22 except that the control gates of multiplexer 24 receive different, decoded, select signals labeled "SELVSS1" and "SELNEG1". Also, multiplexer 26 is the same as multiplexer 22 except that the control gates of multiplexer 26 receive select signals labeled "SELVSSN" and "SELNEGN".

Control circuit 30 has a first input for receiving a clock signal labeled "CLK", a second input for receiving a plurality of column address signals labeled "COL ADDR", a third input for receiving a write enable signal labeled "WE", a fourth input for receiving test information labeled "TEST INFO", a plurality of outputs for providing decoded select signals including a first output for providing a select signal labeled "SELVSS0", and a second output for providing a select signal labeled "SELNEG0". During a write operation, control circuit 30 directs the multiplexer to first couple VSS to a selected column having a weak cell, decouple VSS from the selected column, and then couple VNEG to the selected column. Control circuit 30 can be shared across multiple columns in memory array 12. Alternatively, control circuit 30 can be implemented on a column-by-column basis for each column in memory array 12.

A word line driver block (not shown) is coupled to all of the word lines of memory array 12, such as word lines labeled WL0, WL1, and WLM, and in response to a row address, provides a word line voltage to select a row. A column address selects a bit line pair for a read or a write operation. Write drivers 16, 18, and 20 are coupled to a bit line pair and function to couple a bit line pair to receive an input data signal labeled, for example, "DI0" and "DIB0". The write drivers also receive a write column select signal labeled, for example, "WCOLB0", "WCOLB1", and "WCOLBN" and selects which bit line pair will receive input data. Note that the write column select signals are active low signals. Column logic circuits, such as column decoders, precharge and equalization circuits, bit line loads, sense amplifiers, and the like are not illustrated for the purposes of clarity and simplicity.

Charge pump 28 has a first input for receiving an enable signal labeled "EN", one or more trim signals labeled "TRIM", a third input for receiving signals TEST INFO, a fourth input for receiving a power supply voltage labeled "VDD", and an output for providing a negative voltage labeled "VNEG". Charge pump 28 is a conventional charge pump for boosting a received voltage to a different voltage. In the illustrated embodiment, charge pump 28 receives a positive power supply voltage, for example, 0.9 volts, and provides a negative output voltage of, for example, −200 millivolts (mV). During operation, charge pump 28 provides a relatively constant negative voltage to maintain charge on capacitor 44. During a write operation, the negative voltage is used to decrease the voltage of a select bit line to below ground to assist a selected memory cell to change logic states. The charge pump can be any type of charge pump, multi-stage or single-stage, that will maintain a negative voltage at its output.

During a write operation to a selected memory cell, for example, memory cell 14, write driver 16 will receive input data signals DI0/DIB0 to be stored in a predetermined location in memory array 12. At the beginning of the write operation, the bit line pairs of the memory array are typically precharged and equalized to a common voltage near the positive power supply voltage. To begin the write operation, a write enable signal WE is asserted as a logic high to control 30. A row and column address is provided to select a memory cell, for example, memory cell 14. The complementary data signals DI0/DIB0 are provided to bit line pair BL0/BLB0 to initiate writing to cell 14. The column select signals WCOLB0 causes the data signals DI0/DIB0 to be coupled to the selected bit line pair and thus to the selected memory cell. A complementary voltage on the bit line pair causes a logic state of the storage nodes of the selected memory cell to change state, if necessary. For example, in the case where a logic one is written to bit line pair BL0/BLB0, data signal DI0 will be a logic high potential and data signal DIB0 will be a logic low potential. The logic low data signal DIB0 and the logic low signal WCOLB0 of write driver 16 will cause NOR logic gate 38 to output a logic high, thus making transistor 34 conductive. Transistor 32 will be substantially non-conductive allowing bit line BLB0 to remain at a logic high voltage. Select signal SELVSS0 will cause transistor 40 to be conductive, providing a path to VSS (ground) and causing bit line BL0 to be pulled low to about VSS. If memory cell 14 is predetermined to require a negative bit line voltage for write assistance, then a predetermined time after signal SELVSS0 is asserted, signal SELNEG0 will be asserted causing transistor 42 to become conductive. Signal SELVSS0 will be deasserted, or negated, before signal SELNEG0 is asserted. Bit line BL0 will be pulled negative making it easier for the storage nodes of memory cell 14 to change state, if necessary, to store the new state. Signals SELVSS0 and SELNEG0 are non-overlapping signals to prevent the negative voltage VNEG from being coupled to VSS any time during operation. After the write operation, the word line is deselected and both bit lines of the bit line pair are returned to the precharge potential.

Due to high yield requirements for the large number of memory cells used on a typical SOC (system on a chip), and a relatively high statistical variation of the memory cells on a processed wafer, some memory cells will be weaker and more difficult to write than other memory cells. If the memory cell, such as memory cell 14, is more difficult to write because of, for example, process variations, the cell may not be successfully written. Low power supply voltages will make the problem worse. In accordance with the illustrated embodiment, the ability to write to the memory cells is improved by boosting the voltage on the bit line negative, or below ground potential. However, the generation of a negative voltage using a charge pump consumes extra power. Hence, it is desirable to use a negative bit line voltage only if needed. Furthermore, if a negative bit line voltage is needed, it is preferred that the charge pump be used to drain charge only after the bit line has reached close to ground potential. The majority of the charge on the positively charged bit line BL0 is thus initially drained to the VSS power supply terminal, thereby minimizing the charge that is subsequently drained into the NVEG terminal. Therefore, to achieve the most power-efficient write operation, it is important that the bit line voltage be boosted at the correct time. In one embodiment, the bit line voltage is pulled to ground and then boosted negative. In another embodiment, the bit line voltage may be pulled to a different voltage before boosting negative. Charge pump 28 is enabled during normal operation if it is determined that a negative write assist voltage is needed. Alternately, charge pump 28 may always be enabled. An enable signal EN is provided to allow charge pump 28 to be disabled for, for example, memory testing. During testing of memory 10, the negative output VNEG may be adjusted to provide a different negative output voltage using signal TRIM. The test results may be stored in registers, non-volatile memory, or the like, and may be used to determine whether or not to enable charge pump 28, what the negative output voltage should be, and which cells are weak and need to be assisted during write operations. Memory array 12 may be first tested without enabling charge pump 28. If the memory fails, then charge pump 28 may be enabled and memory array 12 tested with different values of VNEG. If no weak bits are found in memory array 12, then charge pump 28 may not be enabled for operation. The TEST INFO inputs can be used to specify operation of charge pump 28 during functional operation of memory array 12.

Figure 2:
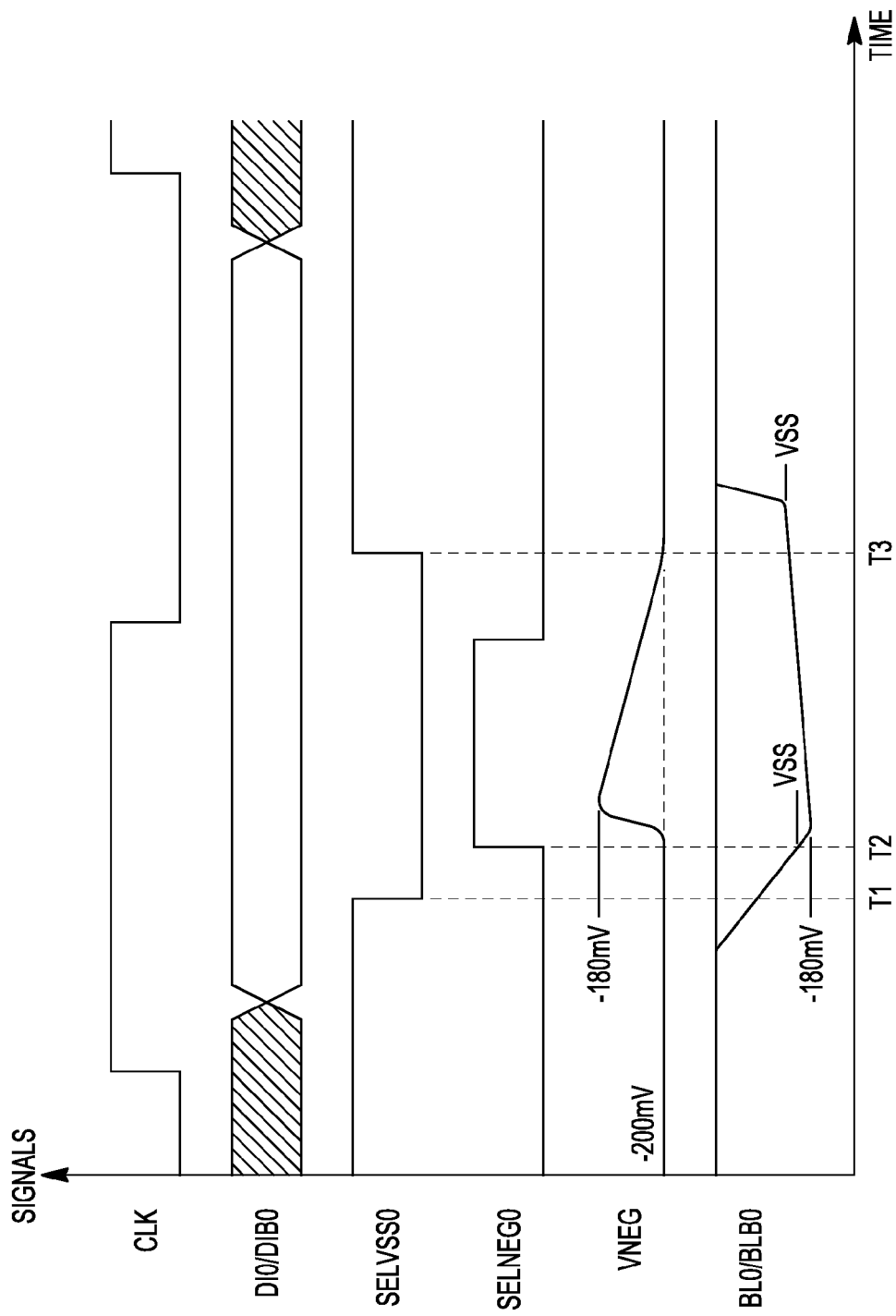
FIG. 2 illustrates a timing diagram of various signals of the memory of FIG. 1 during a write operation.

FIG. 2 illustrates a timing diagram of various signals of the memory of FIG. 1 during a write operation. Assume, for example, that memory cell 14 is being written and a column address is provided that selects bit lines BL0/BLB0. Complementary data in signals DI0/DIB0 are provided to write driver 16 along with a write column select signal (see FIG. 1). Note that the cross-hatching indicates that data in signals DI0/DIB0 are invalid during that time period. Multiplexer signal SELVSS0 is a logic high, causing transistor 40 to be conductive. One of transistors 32 or 34 is made conductive by the state of the data in signals DI0/DIB0, coupling one of the bit lines to VSS, or ground in the illustrated embodiment. At time T1, signal SELVSS0 is negated, causing transistor 40 to become substantially non-conductive. At time T2, signal SELNEG0 is asserted as a logic high, causing transistor 42 to become conductive. The selected logic low bit line is boosted negative. In the illustrated embodiment, VNEG is provided at −200 mV. However, as can be seen after time T2, the voltage of VNEG is increased, or approaches VSS, because of charge sharing between the bit lines and capacitor 44. In the illustrated embodiment, VNEG is increased by 20 mV to −180 mV. In another embodiment, voltage VNEG may vary by at least 10 millivolts. How much VNEG increases depends on the relative capacitance of capacitor 44 to the total bit line capacitance that is electrically connected to VNEG. Note that in another embodiment, the boosted bit line voltage may be different. The bit line voltage begins to separate in response to the data in signals and the logic low bit line is first pulled to about VSS potential at time T2. At time T2, the bit line is coupled to VNEG, causing a bit line to be pulled negative after time T2. At the end of the write operation, signal SELNEG0 is negated, causing transistor 42 to be substantially non-conductive. At time T3, signal SELVSS0 is reasserted, causing transistor 40 to be conductive in preparation for the next write operation and the bit lines are precharged. Note that the write operation required about one half of a cycle of clock signal CLK. In another embodiment, the write operation may require a different time period. Also, in the illustrated embodiment, the logic low data line is boosted below ground. In other embodiments, the boosted voltage level may be different.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

It is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of circuits or intermedial components. Likewise, any two components so associated can also be viewed as being "operably connected," or "operably coupled," to each other to achieve the desired functionality.

Also for example, in one embodiment, the illustrated elements of integrated circuit memory 10 are circuitry located on a single integrated circuit or within a same device. Alternatively, integrated circuit memory 10 may include any number of separate integrated circuits or separate devices interconnected with each other. For example, charge pump 28 may be located on a same integrated circuit memory array 12 or on a separate integrated circuit separate from other elements of memory 10. Also, charge pump 28 may also be shared by multiple memory arrays 12.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of writing data in a memory wherein the memory comprises a subarray having columns of bit line pairs, comprising:
   selecting a first column for writing;
   initiating the writing by applying a logic high to a first bit line of the first column and a first potential to a second bit line of the first column that is lower than the logic high;
   providing a second potential that is lower than the first potential; and
   removing the first potential and applying the second potential to the second bit line.

2. The method of claim 1, wherein the step of initiating the writing is further characterized by the subarray being powered by a voltage differential no less than a difference between the logic high and the first potential.

3. The method of claim 2, wherein the step of initiating the writing is further characterized by the first potential being ground.

4. The method of claim 3 further comprising:
   returning the first and second bit line to a common voltage.

5. The method of claim 4, further comprising:
   enabling a word line that intersects the first column prior to the step of removing; and
   disabling the word line prior to the step of returning.

6. The method of claim 1 further comprising:
   selecting a second column for writing;
   applying the logic high to a first bit line of the second column and the first potential to a second bit line of the second column; and
   returning the first and second bit lines of the second column to the common voltage without lowering the second bit line below the first potential.

7. The method of claim 6, further comprising:
   testing the first and second columns for weak bits for writing;
   identifying a weak bit for writing in the first column; and
   finding no weak bits for writing in the second column.

8. The method of claim 7 wherein the following steps occur simultaneously:
   initiating the writing by applying a logic high to a first bit line of the first column and a first potential to a second bit line of the first column; and
   applying the logic high to a first bit line of the second column and the first potential to a second bit line of the second column.

9. The method of claim 7 wherein the step of initiating the writing by applying a logic high to a first bit line of the first column and a first potential to a second bit line of the first column occurs before the step of applying the logic high to a first bit line of the second column and the first potential to a second bit line of the second column.

10. The method of claim 1, wherein the step of removing the first potential and applying a second potential to the second bit line is further characterized by the second potential varying at least 10 millivolts during its application to the second bit line.

11. A memory, comprising:
    a subarray having columns, wherein each column has a pair of bit lines;
    a first write driver for maintaining a logic high at a first selected bit line of a first selected pair of bit lines and providing a logic low to a second selected bit line of the first selected pair of bit lines by coupling a negative power supply node to the second selected bit line;
    a charge pump for providing an output at a negative voltage;
    a first multiplexer having a first input coupled to the output of the charge pump, a second input coupled to a low power supply terminal for receiving a low voltage that is greater than the negative voltage, and an output coupled to the negative power supply node.

12. The memory of claim 11, wherein the low voltage is ground potential, and wherein the memory further comprises a capacitor coupled between a node at a predetermined potential and the output of the charge pump.

13. The memory of claim 12, wherein the first write driver provides the logic high to the first selected bit line based upon a logic state of a data input signal received by the first write driver.

14. The memory of claim 13 further comprising a controller coupled to the first multiplexer that directs the first multiplexer to couple the low power supply terminal to the first write driver during an initial portion of a write cycle and directs the first multiplexer to couple the output of the charge pump to the first write driver after the initial portion of the write cycle.

15. The memory of claim 13 further comprising a controller coupled to the first multiplexer that directs the first multiplexer to couple the low power supply terminal to the negative power supply node during an initial portion of a write cycle and determines if the first multiplexer should couple the output of the charge pump to the negative power supply node after the initial portion of the write cycle or if the first multiplexer should continue coupling the low power supply terminal to the negative power supply node during all of the write cycle.

16. The memory of claim 15, wherein the controller is further characterized as receiving test information that indicates which of the columns in the subarray are to be written with one of its bit lines coupled to the output of the charge pump.

17. The memory of claim 11 further comprising:
- a second write driver for maintaining a logic high to a first selected bit line of a second selected pair of bit lines and providing a logic low to a second selected bit line of the second selected pair of bit lines by coupling a second negative power supply node to the second selected bit line of the second selected pair of bit lines; and
- a second multiplexer having a first input coupled to the output of the charge pump, a second input coupled to a low power supply terminal for receiving a low voltage that is greater than the negative voltage, and an output coupled to the second negative power supply node.

18. A method, comprising:
- providing a memory having a subarray having a plurality of columns, wherein each column of the plurality of columns has a pair of bit lines;
- writing data to a bitcell in a first selected column of the plurality of columns by enabling a word line that is coupled to the bitcell and applying a logic high to a first bit line of the first selected column and a logic low to a second bit line of the first selected column, wherein the step of applying the logic low comprises:
    - applying a first potential to the second bit line that is a lower voltage than the logic high for an initial portion of a first write cycle;
    - providing a negative voltage; and
    - applying the negative voltage to the second bit line during a subsequent portion of the first write cycle.

19. The method of claim 18, further comprising:
- writing data to a bitcell in a second selected column of the plurality of columns by enabling a word line that is coupled to the bitcell and applying a logic high to a first bit line of the second selected column and a logic low to a second bit line of the second selected column, wherein the step of applying the logic low to the second bit line of the second selected column comprises:
    - applying the first potential to the second bit line of the second selected column from a beginning of a second write cycle to an end of the second write cycle; and
    - applying a common voltage to the first and second bit lines of the second selected column after the step of applying the first potential to the second bit line of the second selected column.

20. The method of claim 19, wherein the step of providing a memory is further characterized by the first selected column having a bitcell that is weak for writing.

* * * * *